(12) United States Patent
Espinoza et al.

(10) Patent No.: US 8,429,438 B2
(45) Date of Patent: Apr. 23, 2013

(54) METHOD AND APPARATUS FOR TRANSFERRING DATA BETWEEN ASYNCHRONOUS CLOCK DOMAINS

(75) Inventors: Anne Espinoza, Austin, TX (US); John MacLaren, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 440 days.

(21) Appl. No.: 12/435,550

(22) Filed: May 5, 2009

(65) Prior Publication Data
US 2010/0287401 A1 Nov. 11, 2010

(51) Int. Cl.
*G06F 1/12* (2006.01)

(52) U.S. Cl.
USPC ........................................ 713/503; 713/401

(58) Field of Classification Search .................... 713/400
See application file for complete search history.

(56) References Cited

U.S. PATENT DOCUMENTS

| | | | | |
|---|---|---|---|---|
| 7,177,379 B1* | 2/2007 | Shihadeh et al. | | 375/354 |
| 7,433,262 B2* | 10/2008 | Vergnes et al. | | 365/233.1 |
| 7,450,443 B2* | 11/2008 | Cheng | | 365/193 |
| 7,548,470 B2* | 6/2009 | Cheng | | 365/193 |
| 7,661,084 B2* | 2/2010 | Hovis et al. | | 716/100 |
| 7,701,802 B2* | 4/2010 | Vergnes et al. | | 365/233.1 |
| 7,703,063 B2* | 4/2010 | Hovis et al. | | 716/122 |
| 7,872,937 B2* | 1/2011 | Searles et al. | | 365/230.06 |
| 2008/0062780 A1* | 3/2008 | Cheng | | 365/193 |
| 2008/0123445 A1* | 5/2008 | Vergnes et al. | | 365/194 |
| 2009/0033391 A1* | 2/2009 | Vergnes et al. | | 327/161 |
| 2009/0046813 A1* | 2/2009 | Hovis et al. | | 375/317 |
| 2009/0240968 A1* | 9/2009 | Kizer et al. | | 713/401 |
| 2009/0245010 A1* | 10/2009 | Searles et al. | | 365/230.06 |
| 2009/0257286 A1* | 10/2009 | Jeon | | 365/189.05 |
| 2009/0261853 A1* | 10/2009 | Kato | | 324/765 |
| 2011/0047319 A1* | 2/2011 | Jeon et al. | | 711/103 |

* cited by examiner

*Primary Examiner* — Ryan Stiglic
(74) *Attorney, Agent, or Firm* — Sawyer Law Group, P.C.

(57) ABSTRACT

An invention is provided for transferring data between asynchronous clock domains. The asynchronous clock domains include a source clock domain operating with a source clock signal and a receiving clock domain operating with a receiving clock signal. The invention includes determining a phase shift relationship between the source clock signal and a signal. When the phase shift relationship is below a predetermined threshold the data is transferred between the source clock domain and the receiving clock domain using a first plurality of stage operations. When the phase shift relationship is above the predetermined threshold, the data is transferred between the source clock domain and the receiving clock domain using a second plurality of stage operations that delay data transfer an additional half period of the source clock signal.

13 Claims, 10 Drawing Sheets

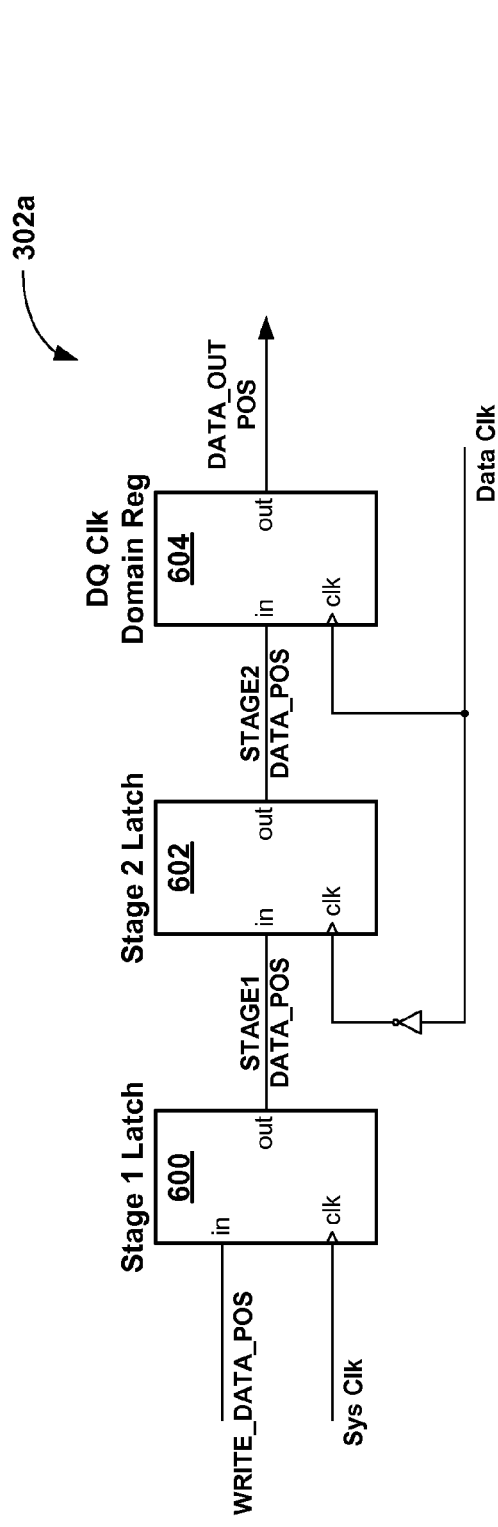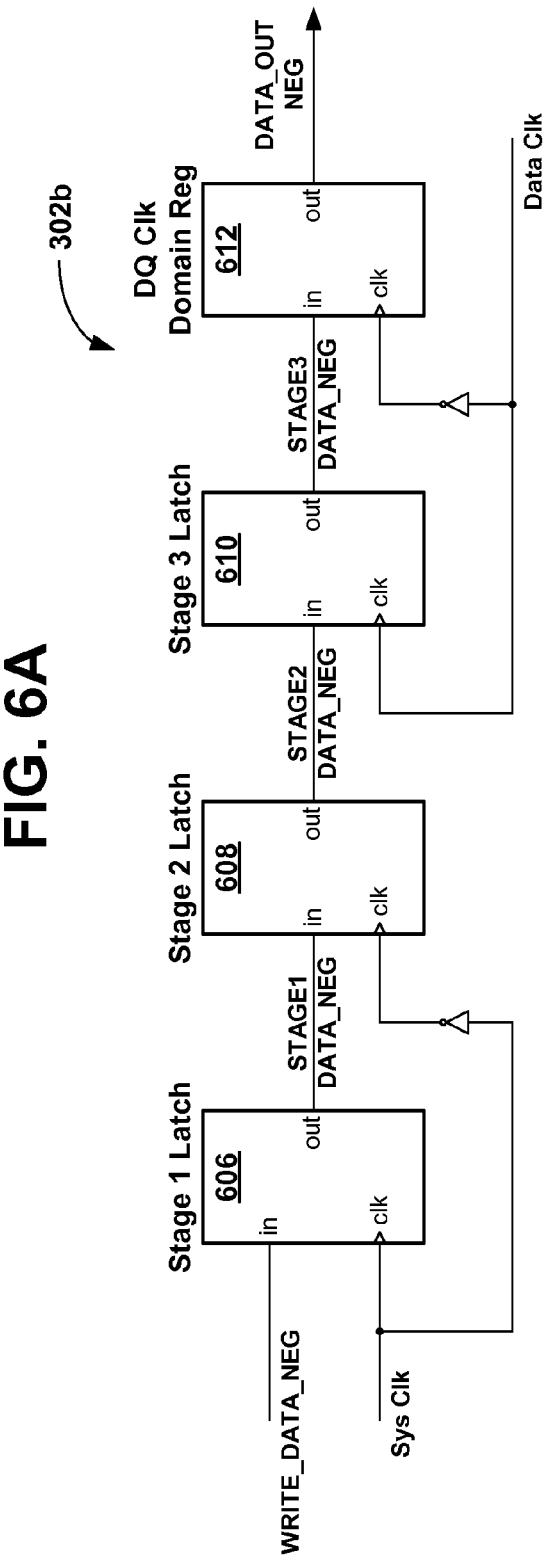
FIG. 6A
FIG. 6B

METHOD AND APPARATUS FOR TRANSFERRING DATA BETWEEN ASYNCHRONOUS CLOCK DOMAINS

BACKGROUND OF THE INVENTION

1. Field of the Invention

This invention relates generally to random access memory, and more particularly to transferring data between asynchronous clock domains.

2. Description of the Related Art

Often, computer related devices require communication across differing clock domain boundaries. For example, components related to a system clock may operate in the system clock domain while memory components operate in a different data clock domain. One such memory device is double data rate (DDR) synchronous dynamic random access memory (SDRAM), which utilizes a data strobe signal to transfer data on each rising and falling edge of the data strobe signal. To coordinate the transfer of data to and from a DDR SDRAM memory device, a synchronization circuit in the form of a memory controller often is used with the memory device. The memory controller uses the data strobe signal to determine when the read data is valid and can be latched.

FIG. 1 is a block diagram showing a prior art DDR DIMM 100 architecture using DDR SDRAM integrated circuit devices. As illustrated in FIG. 1, the DDR DIMM 100 includes a plurality of DDR memory devices 102a-102h disposed on a printed circuit board 104. Coupled to each DDR memory device 102a-102h is a set of data/data strobe signal (DQS) lines 106. Each set of data/DQS lines 106 provide I/O for each DDR memory devices 102a-102h. As will be appreciated by those skilled in the art, DDR memory devices require separate control lines that are unique to each memory device and distributed in parallel. These parallel control lines are known as data strobe signal (DQS) lines and are generated from a differential clock fed to each DDR memory device 102a-102h and a DLL located within each DDR memory device 102a-102h. The DQS signal allows each DDR memory device 102a-102h to launch data from the memory device at the same instant as a data-valid signal. Also included in the DDR DIMM 100 are clock and command signal lines 108, which provide clock and command signals to each of the DDR memory devices 102a-102h.

As illustrated in FIG. 1, the clock and command signal lines 108 are connected to each DDR memory device 102a-102h on the DDR DIMM 100 in a parallel configuration. That is, the clock and command signal lines 108 are provided to each DDR memory device 102a-102h simultaneously. In this manner, each DDR memory device 102a-102h provides or receives data to/from its associated data/DQS lines 106 at approximately the same time. Because each DDR memory device 102a-102h provides or receives data to/from its associated data/DQS lines 106 at approximately the same time, the relationship between the system clock and the data clock is known at the time of design. However, there are instances when this relationship is unknown at the time of design. Such an instance is when double data rate three (DDR3) SDRAM is used, wherein asynchronous clock domains present unknown timing relationships at design.

For example, FIG. 2 is a block diagram showing a prior art DDR3 DIMM 200 architecture using DDR3 SDRAM integrated circuit devices. As illustrated in FIG. 2, the DDR3 DIMM 200 includes a plurality of DDR3 memory devices 202a-202h disposed on a printed circuit board 204. Coupled to each DDR3 memory device 202a-202h is a set of data/DQS lines 206, which provide I/O for each DDR3 memory devices 202a-202h. Also included in the DDR3 DIMM 200 are clock and command signal lines 208, which provide clock and command signals to each of the DDR3 memory devices 202a-202h.

Unlike the DDR DIMM 100 illustrated in FIG. 1, the DDR3 DIMM 200 is configured in a fly-by topology in which the clock and command signal lines 208 are connected in series to each DDR3 memory device 202a-202h on the DDR3 DIMM 200 in a daisy chain configuration. That is, the clock and command signal lines 208 are first provided to DDR3 memory device 202a, then to DDR3 memory device 202b, then to DDR3 memory device 202c, and so on to DDR3 memory device 202h. Consequently, DDR3 memory device 202a receives and acts on the received clock and command signals prior to DDR3 memory device 202b. Similarly, DDR3 memory device 202b receives and acts on the received clock and command signals prior to DDR3 memory device 202c, and so on until DDR3 memory device 202h receives and acts on the received clock and command signals last after DDR3 memory devices 202a-202g.

When a write command is provided to the DDR3 DIMM 200, each DDR3 memory device 202a-202h will see the command at a slightly different time, and as a result, will need to receive data on the data/DQS lines 206 at a slightly different time in order to align the data with the command on the DDR3 DIMM 200. Similarly, when a read command is provided to the DDR3 DIMM 200, each DDR3 memory device 202a-202h will provide the requested read data on its data/DQS lines 206 at a slightly different time. Thus, each DDR3 memory device 202a-202h receives the system clock at a slightly different time, thus requiring the DQS signal to be asserted at a slightly different time for each DDR3 memory device 202a-202h to properly align the Data strobe with the system clock at each device. Although the data clock has a fixed relationship to the data strobe at each device, the fly-by topology of the DDR3 DIMM 200 causes the each data strobe and data clock to have an asynchronous relationship with the system clock. Thus, DDR3 SDRAM presents asynchronous clock domains between the system clock and the data clock at each DDR3 memory device 202a-202h, resulting in unknown timing relationships at design.

In view of the foregoing, there is a need for systems and methods for transferring data between asynchronous clock domains. The methods should allow for synchronizing data transfer when the relationship between the asynchronous clock domains is not known at the time of the design of the system.

SUMMARY OF THE INVENTION

Broadly speaking, embodiments of the present invention address these needs by transferring data between asynchronous clock domains based on a phase shift relationship between a source clock, such as the system clock, and a signal operating in the receiving clock domain, such as a data strobe (DQS) signal. Depending on the phase shift relationship, embodiments of the present invention utilize one of two sets of stage operations to transfer data between the source clock domain and the receiving clock domain.

For example, in one embodiment, a method for transferring data between asynchronous clock domains is disclosed. Here, the asynchronous clock domains include a source clock domain operating with a source clock signal, such as the system clock, and a receiving clock domain operating with a receiving clock signal, such as the data clock signal. The method includes determining a phase shift relationship between the source clock signal and a signal, such as a DQS signal, which generally has a fixed relationship with the data clock signal. When the phase shift relationship is below a predetermined threshold the data is transferred between the source clock domain and the receiving clock domain using a first domain transfer logic. When the phase shift relationship is above the predetermined threshold, the data is transferred between the source clock domain and the receiving clock domain using a second domain transfer logic that delays data transfer an additional half period of the source clock signal. For example, the first domain transfer logic can include a first plurality of stage operations that includes latching the data on a rising edge of the source clock signal to generate stage one data, and latching the stage one data on a falling edge of the receiving clock signal to generate stage two data. The stage two data then can be stored on a rising edge of the receiving clock to generate synchronized data operable to be supplied to circuitry disposed in the receiving clock domain. The second domain transfer logic can include a second plurality of stage operations that can include, for example, latching the data on a rising edge of the source clock signal to generate stage one data, latching the stage one data on a falling edge of the source clock signal to generate stage two data, and then latching the stage two data on a falling edge of the receiving clock signal to generate stage three data, which can be stored on a rising edge of the receiving clock to generate synchronized data operable to be supplied to circuitry disposed in the receiving clock domain.

In addition to positive edge data, embodiments of the present invention can further be utilized to transfer negative edge data between asynchronous clock domains. For example, when the phase shift relationship is below the predetermined threshold a third plurality of stage operations can be used to transfer data. For example, these operations can include latching the negative edge data on a rising edge of the source clock signal to generate stage one negative edge data, latching the stage one negative edge data on a falling edge of the source clock signal to generate stage two negative edge data, and latching the stage two negative edge data on a rising edge of the receiving clock signal to generate stage three negative edge data, which can be utilized in the receiving clock domain on the next falling edge of the receiving clock signal. When the phase shift relationship is above the predetermined threshold a fourth plurality of stage can be used. These operations can include, for example, latching the negative edge data on a rising edge of the source clock signal to generate stage one negative edge data, latching the stage one negative edge data on a rising edge of the source clock signal to generate stage two negative edge data, and latching the stage two negative edge data on a rising edge of the receiving clock signal to generate stage three negative edge data, which can be utilized on the following falling edge of the receiving clock.

In a further embodiment, a memory controller capable of transferring data between asynchronous clock domains is disclosed. As above, the asynchronous clock domains include a source clock domain operating with a source clock signal and a receiving clock domain operating with a receiving clock signal. The memory controller includes logic that determines a phase shift relationship between the first clock signal and first signal. Logic also is included that transfers data between the source clock domain and the receiving clock domain using a first domain transfer logic when the phase shift relationship is below a predetermined threshold. In addition, similar to above, logic is included that transfers the data between the source clock domain and the receiving clock domain using a second domain transfer logic when the phase shift relationship is above the predetermined threshold, wherein the second domain transfer logic delays data transfer an additional half period of the first source clock signal.

In this manner, embodiments of the present invention enable transferring of data between asynchronous clock domains, without prior knowledge of the exact relationship between the clock domains. As a result, embodiments of the present invention can provide more or less delay to appropriately transfer the data between the two asynchronous clock domains. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which:

FIG. 6A is a block diagram showing small shift domain transfer logic for transferring data on the positive clock edge, in accordance with an embodiment of the present invention;

FIG. 6B is a block diagram showing small shift domain transfer logic for transferring data on the negative clock edge, in accordance with an embodiment of the present invention;

DETAILED DESCRIPTION OF THE PREFERRED EMBODIMENTS

An invention is disclosed for transferring data between asynchronous clock domains. Broadly speaking, embodiments of the present invention transfer data based on a phase shift relationship between a source clock, such as the system clock, and a signal operating in the receiving clock domain, such as a data strobe (DQS) signal. Depending on the phase shift relationship, embodiments of the present invention utilize one of two sets of stage operations to transfer data between the source clock domain and the receiving clock domain. The stage operations, broadly speaking, are sequential latching or data transfer operations, each occurring on predefined edges of the source and receiving clock signals.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
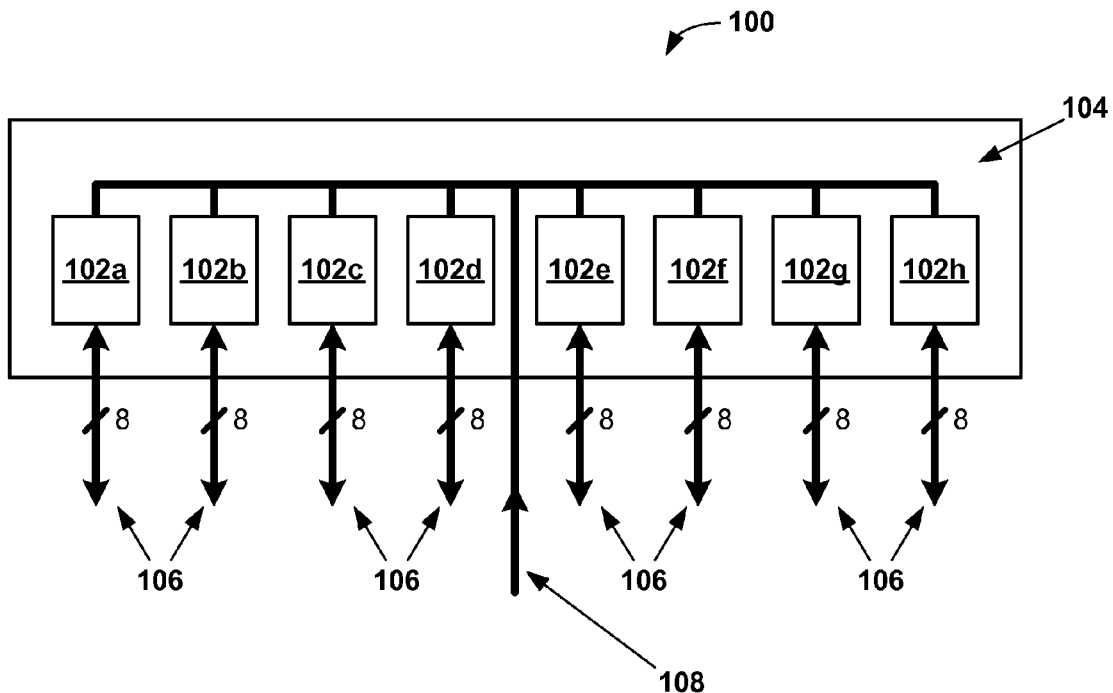
FIG. 1 is a block diagram showing a prior art DDR DIMM architecture using DDR SDRAM integrated circuit devices.
Figure 2:
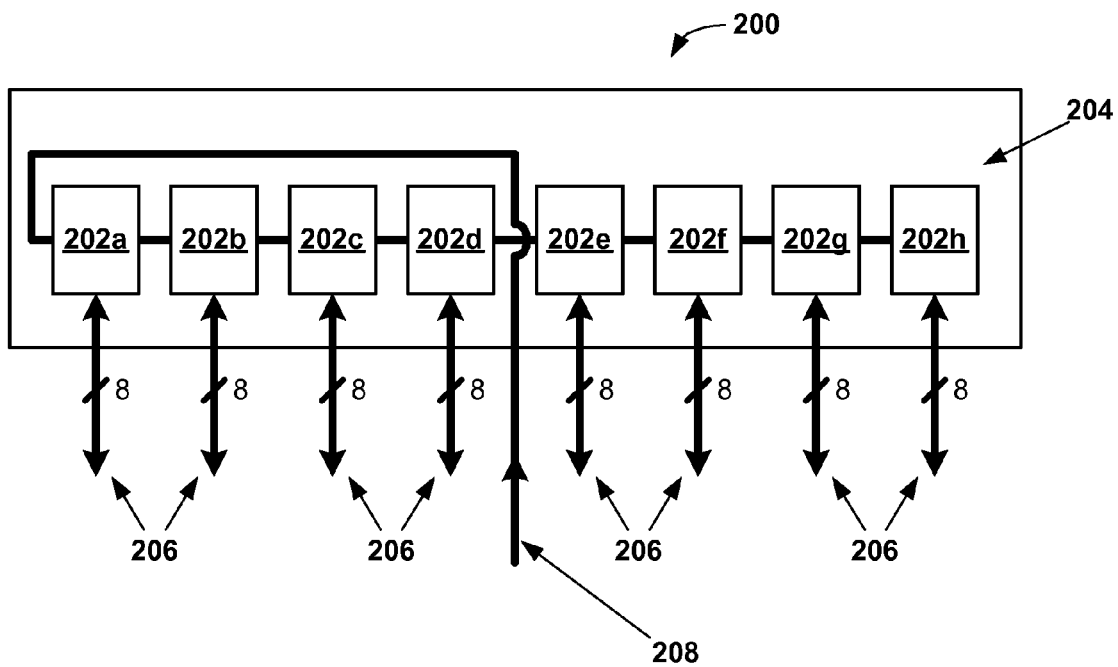
FIG. 2 is a block diagram showing a prior art DDR3 DIMM architecture using DDR3 SDRAM integrated circuit devices.
Figure 3:
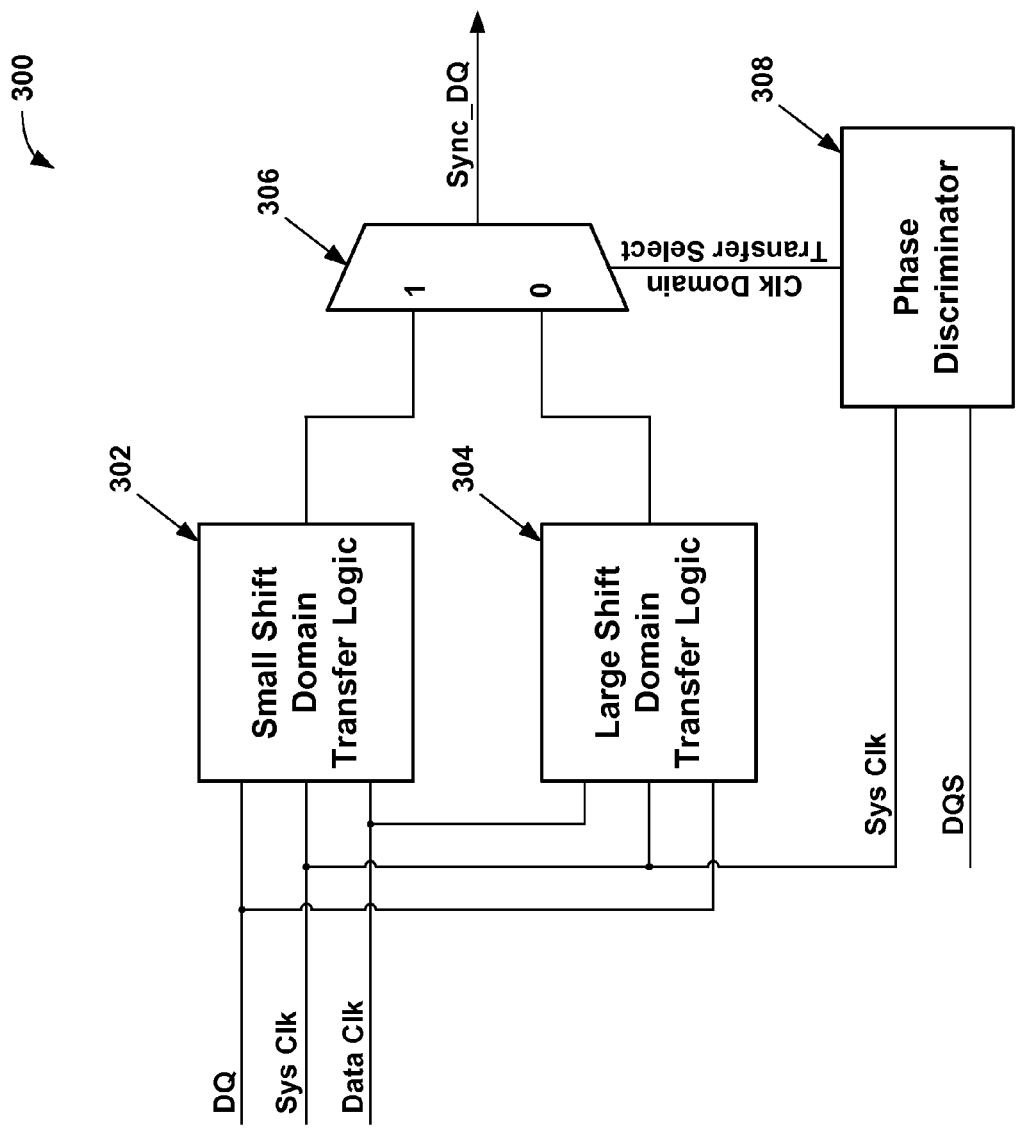
FIG. 3 is a block diagram showing a system for transferring data between asynchronous clock domains, in accordance with an embodiment of the present invention.

FIGS. 1 and 2 were described in terms of the prior art. FIG. 3 is a block diagram showing a system 300 for transferring data between asynchronous clock domains, in accordance with an embodiment of the present invention. As will be described in greater detail subsequently, embodiments of the present invention transfer data between asynchronous source and receiving clock domains based on the phase shift relationship between a clock signal for the source clock domain and a signal related to the receiving clock domain. FIG. 3 illustrates an exemplary system for performing such a data transfer utilizing DDR3 memory devices. Here, the source clock domain operates on the system clock signal and the receiving clock domain operates on the data clock signal.

The system 300 utilizes two different sets of logic to transfer data between the source clock domain and the receiving clock domain based on the above mentioned phase shift relationship. More specifically, the system 300 includes both small shift domain transfer logic 302 and large shift domain transfer logic 304 for use in providing appropriate delay to facilitate data transfer between the system clock domain and the data clock domain, depending on the phase shift relationship between the system clock and the data strobe (DQS) signal. To this end, both the small shift domain transfer logic 302 and the large shift domain transfer logic 304 receive as input the data (DQ) to be transferred, the system clock, and the data clock. In addition, a multiplexer 306 receives as input, the output of both the small shift domain transfer logic 302 and the large shift domain transfer logic 304. Control for the multiplexer 306 is provided via a select signal from a phase discriminator 308, which receives the system clock and the DQS signal as input.

In operation the, data (DQ), system clock signal, and data clock signal are provided to the small shift domain transfer logic 302, the large shift domain transfer logic 304, and the phase discriminator 308, which also receives the DQS signal associated with a particular device as input. As will be described in greater detail subsequently, both the small shift domain transfer logic 302 and the large shift domain transfer logic 304 utilize a plurality of stage operations to provide an appropriate amount of delay to allow data transfer while avoiding timing problems which can result in setup and hold violations. Thus, both the small shift domain transfer logic 302 and the large shift domain transfer logic 304 provide as output a delayed DQ, wherein the DQ signal from the large shift domain transfer logic 304 is delayed an additional half clock period of the system clock than the DQ signal from the small shift domain transfer logic 302.

The phase discriminator 308 selects which domain transfer logic to use to transfer the data by comparing the phase shift relationship between the system clock and the DQS signal. Based on the phase shift relationship, the phase discriminator 308 selects the output of either the small shift domain transfer logic 302 or the large shift domain transfer logic 304 via the clock domain transfer select signal. Then, based on the value of the clock domain transfer select signal, the multiplexer 306 provides the selected delayed DQ signal as the synchronized DQ signal for use by devices in the receiving clock domain.

Figure 4:
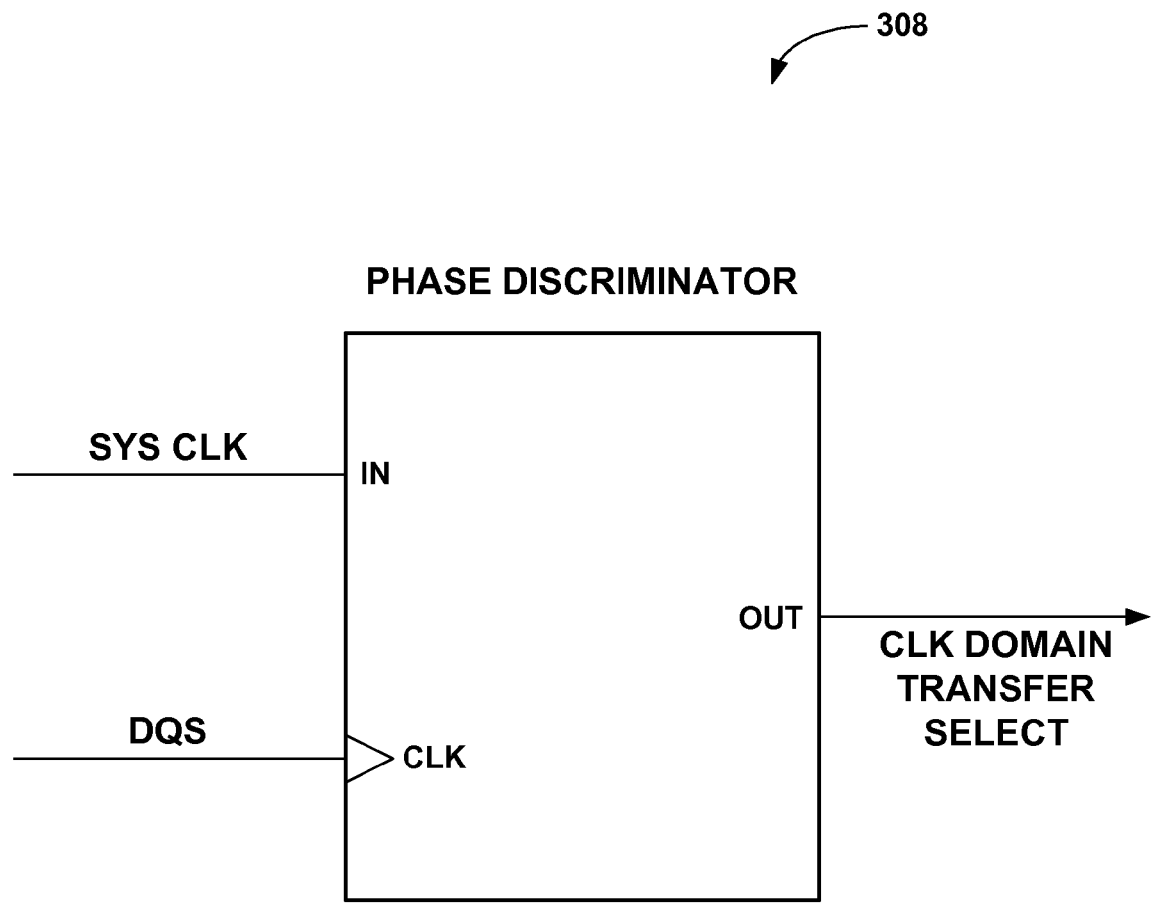
FIG. 4 is a block diagram showing an exemplary phase discriminator, in accordance with an embodiment of the present invention.

FIG. 4 is a block diagram showing an exemplary phase discriminator 308, in accordance with an embodiment of the present invention. As illustrated in FIG. 4, the phase discriminator 308 receives the system clock signal as input, and utilizes the DQS signal as a clock. In this manner, the phase discriminator 308 clocks the value of the system clock when the DQS signal transitions from LOW to HIGH, thus determining the phase shift relationship between the system clock and the DQS signal. In general, the phase discriminator 308 selects the output of either the small shift domain transfer logic 302 or the large shift domain transfer logic 304 based on whether the DQS signal is shifted less than one half a clock period from the system clock signal or greater than one half a clock period from the system clock signal. When the DQS signal is shifted less than one half a clock period from the system clock signal, the phase shift relationship is considered small and thus the phase discriminator 308 selects the small shift domain transfer logic 302 to transfer the data. On the other hand, when the DQS signal is shifted more than one half a clock period from the system clock signal, the phase shift relationship is considered large and thus the phase discriminator 308 selects the large shift domain transfer logic 304 to transfer the data, as illustrated in FIGS. 5A and 5B.

Figure 5A:
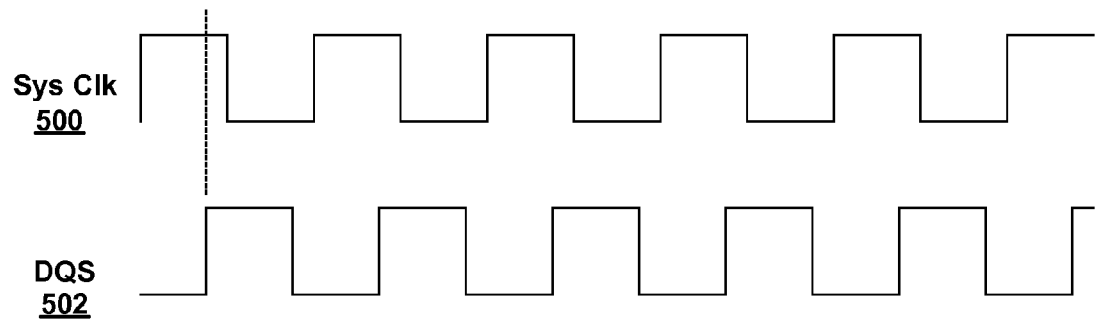
FIG. 5A is a timing diagram showing an exemplary phase shift relationship between the system clock signal and the DQS signal, wherein the phase shift relationship is less than one half a clock period.

FIG. 5A is a timing diagram showing an exemplary phase shift relationship between the system clock signal 500 and the DQS signal 502, wherein the phase shift relationship is less than one half a clock period. When the DQS signal 502 is shifted less than one half a clock period from the system clock signal 500, the system clock signal will be HIGH when the DQS signal transitions from LOW to HIGH. Thus, referring back to FIG. 4, the phase discriminator 308 will sample a HIGH value for the system clock signal. As a result, the clock domain transfer select signal will be HIGH, which in the example of FIG. 3 corresponds to the small shift domain transfer logic 302 output. Thus, the multiplexer 306 provides the delayed DQ signal from the small shift domain transfer logic 302 as the synchronized DQ signal for use by devices in the receiving clock domain when the phase shift relationship between the system clock signal and the DQS signal is less than one half a clock period.

Figure 5B:
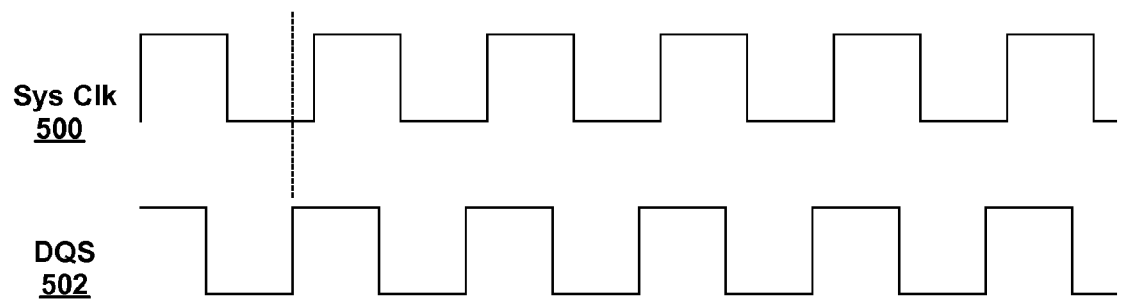
FIG. 5B is a timing diagram showing an exemplary phase shift relationship between the system clock signal and the DQS signal, wherein the phase shift relationship is greater than one half a clock period.

FIG. 5B is a timing diagram showing an exemplary phase shift relationship between the system clock signal 500 and the DQS signal 502, wherein the phase shift relationship is greater than one half a clock period. When the DQS signal 502 is shifted more than one half a clock period from the system clock signal 500, the system clock signal will be LOW when the DQS signal transitions from LOW to HIGH. Thus, referring back to FIG. 4, the phase discriminator 308 will sample a LOW value for the system clock signal. As a result, the clock domain transfer select signal will be LOW, which in the example of FIG. 3 corresponds to the large shift domain transfer logic 304 output. Thus, the multiplexer 306 provides the delayed DQ signal from the large shift domain transfer logic 304 as the synchronized DQ signal for use by devices in the receiving clock domain when the phase shift relationship between the system clock signal and the DQS signal is more than one half a clock period.

As will be appreciated by those skilled in the art, DDR3 memory devices transfer data on both the positive clock edge and the negative clock edge. That is, DDR3 memory devices transfer data when the DQS signal transitions from LOW to HIGH, and when the DQS signal transitions from HIGH to LOW. Thus, both the small shift domain transfer logic 302 and the large shift domain transfer logic 304 include a set of logic for transferring data on the positive clock edge and the negative clock edge.

FIG. 6A is a block diagram showing small shift domain transfer logic 302a for transferring data on the positive clock edge, in accordance with an embodiment of the present invention. As illustrated in FIG. 6A, the small shift domain transfer logic 302a includes a stage one latch 600, a stage two latch 602, and a data clock domain register 604. The stage one latch 600 receives the positive clock edge data (WRITE_DATA_POS) as input and is clocked using the rising edge the system clock signal. The output (STAGE1_DATA_POS) of the stage one latch 600 is provided as input to the stage two latch 602, which is clocked utilizing the falling edge of the data clock signal. The output (STAGE2_DATA_POS) of the stage two latch 602 is provided as input to the data clock domain register 604, which is clocked utilizing the rising edge of the data clock signal. The output (DATA_OUT_POS) of the data clock domain register 604 is available for use within the receiving data clock domain. The latches of the small shift domain transfer logic 302a provide an appropriate delay for positive edge data transfer when the phase shift relationship between the system clock signal and the DQS signal is less than one half a clock period, as illustrated in FIG. 7A.

Figure 7A:
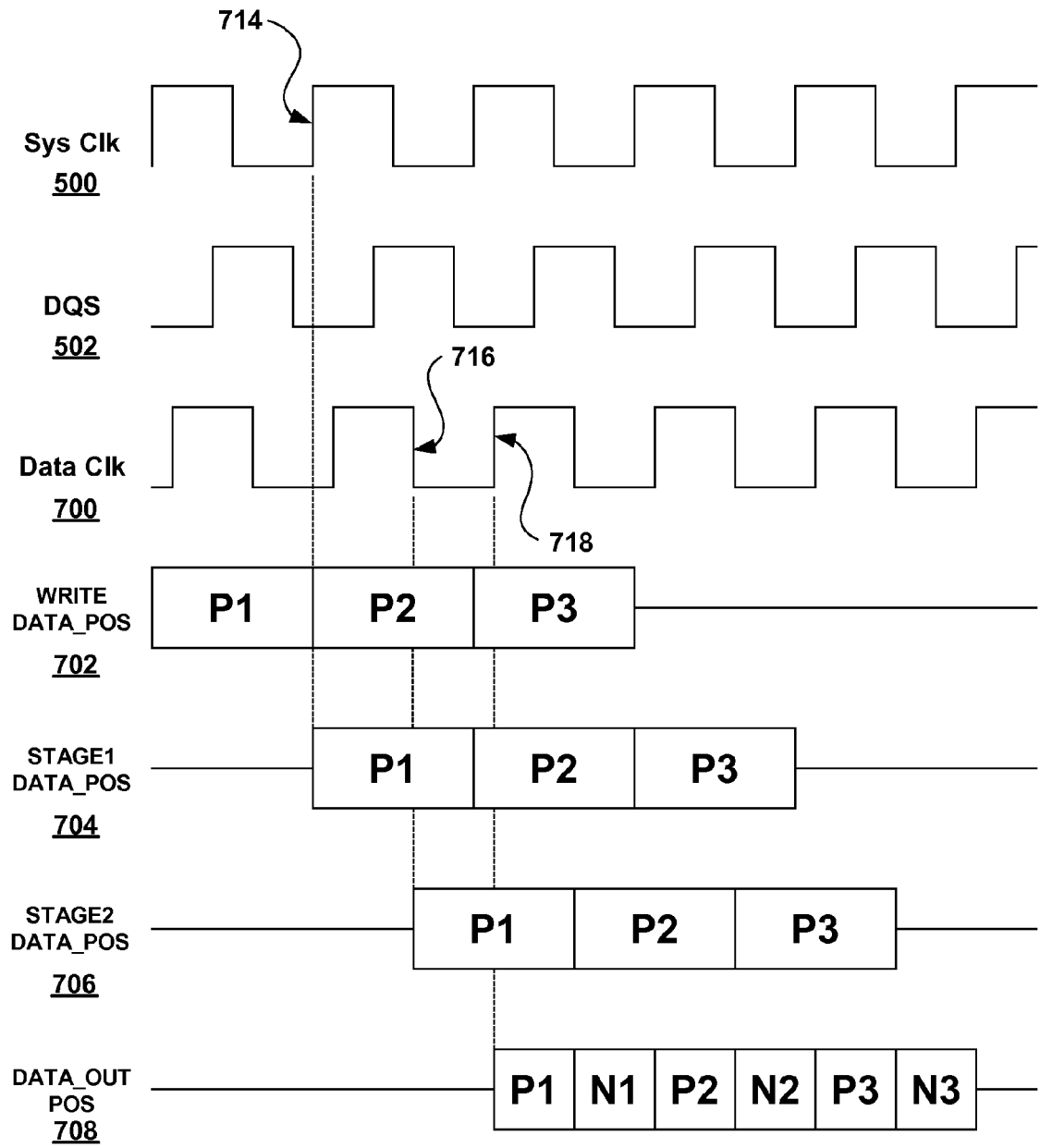
FIG. 7A is a timing diagram illustrating data transfer timing for data transferred on the positive edge of the data clock utilizing small shift domain transfer logic, in accordance with an embodiment of the present invention.

FIG. 7A is a timing diagram illustrating data transfer timing for data transferred on the positive edge of the data clock utilizing small shift domain transfer logic 302a, in accordance with an embodiment of the present invention. The signals illustrated in FIG. 7A include the system clock signal 500, the DQS signal 502, and the data clock signal 700. In addition, signals are shown for the WRITE_DATA_POS signal 702, STAGE1_DATA_POS signal 704, STAGE2_DATA_POS signal 706, DATA_OUT_POS signal 708. The WRITE_DATA_POS signal 702 represents the data to be transferred on the positive edge of the data clock. The STAGE1_DATA_POS signal 704 is the output of the stage one latch 600, while the STAGE2_DATA_POS signal 706 is output of the stage two latch 602. Finally, the DATA_OUT_POS signal 708 is the data to be utilized in the data clock domain on the positive edge of the data clock.

As mentioned above, the latches of the small shift domain transfer logic 302a provide an appropriate delay for positive edge data transfer when the phase shift relationship between the system clock signal and the DQS signal is less than one half a clock period. For example, referring to FIGS. 6A and 7A, to transfer the WRITE_DATA_POS from the system clock domain to the data clock domain, the WRITE_DATA_POS signal is clocked into the stage one latch 600 utilizing the rising edge of system clock signal 500. As shown in FIG. 7A, WRITE_DATA_POS P1 is clocked into the stage one latch 600 on a rising edge of the system clock signal 500 at point 714, and as a result, the P1 data is placed on the STAGE1_DATA_POS signal 704. The P1 data, now on the STAGE1_DATA_POS signal 704, is latched into the stage two latch 602 on the falling edge of the data clock signal 700 at point 716, resulting in the P1 data being placed on the STAGE2_DATA_POS signal 706. Thereafter, on the next rising edge of the data clock signal 700 at point 718, the P1 data is clocked into the data clock domain register 604 and thus placed on the DATA_OUT_POS signal 708 for use in the data clock domain.

As mentioned previously, DDR data is transferred on both the positive edge of the data clock signal and the negative edge of the data clock signal. FIG. 6B is a block diagram showing small shift domain transfer logic 302b for transferring data on the negative clock edge, in accordance with an embodiment of the present invention. The small shift domain transfer logic 302b includes a stage one latch 606, a stage two latch 608, a stage three latch 610, and a data clock domain register 612 for providing negative edge data to devices in the data clock domain.

In operation, the stage one latch 606 receives the negative clock edge data (WRITE_DATA_NEG) as input and is clocked using the rising edge of the system clock signal. The output (STAGE1_DATA_NEG) of the stage one latch 606 is provided as input to the stage two latch 608, which is clocked utilizing the falling edge of the system clock signal. The output (STAGE2_DATA_NEG) of the stage two latch 608 is provided as input to the stage three latch 610, which is clocked utilizing the rising edge of the data clock signal. Finally, the output (STAGE3_DATA_NEG) of the stage three latch 610 is provided as input to the data clock domain register 612, which is clocked utilizing the falling edge of the data clock signal. Hence, the output (DATA_OUT_NEG) of the data clock domain register 612 is available for use within the receiving data clock domain on the falling edge of the data clock. The latches of the small shift domain transfer logic 302b provide an appropriate delay for negative edge data transfer when the phase shift relationship between the system clock signal and the DQS signal is less than one half a clock period, as illustrated in FIG. 7B.

Figure 7B:
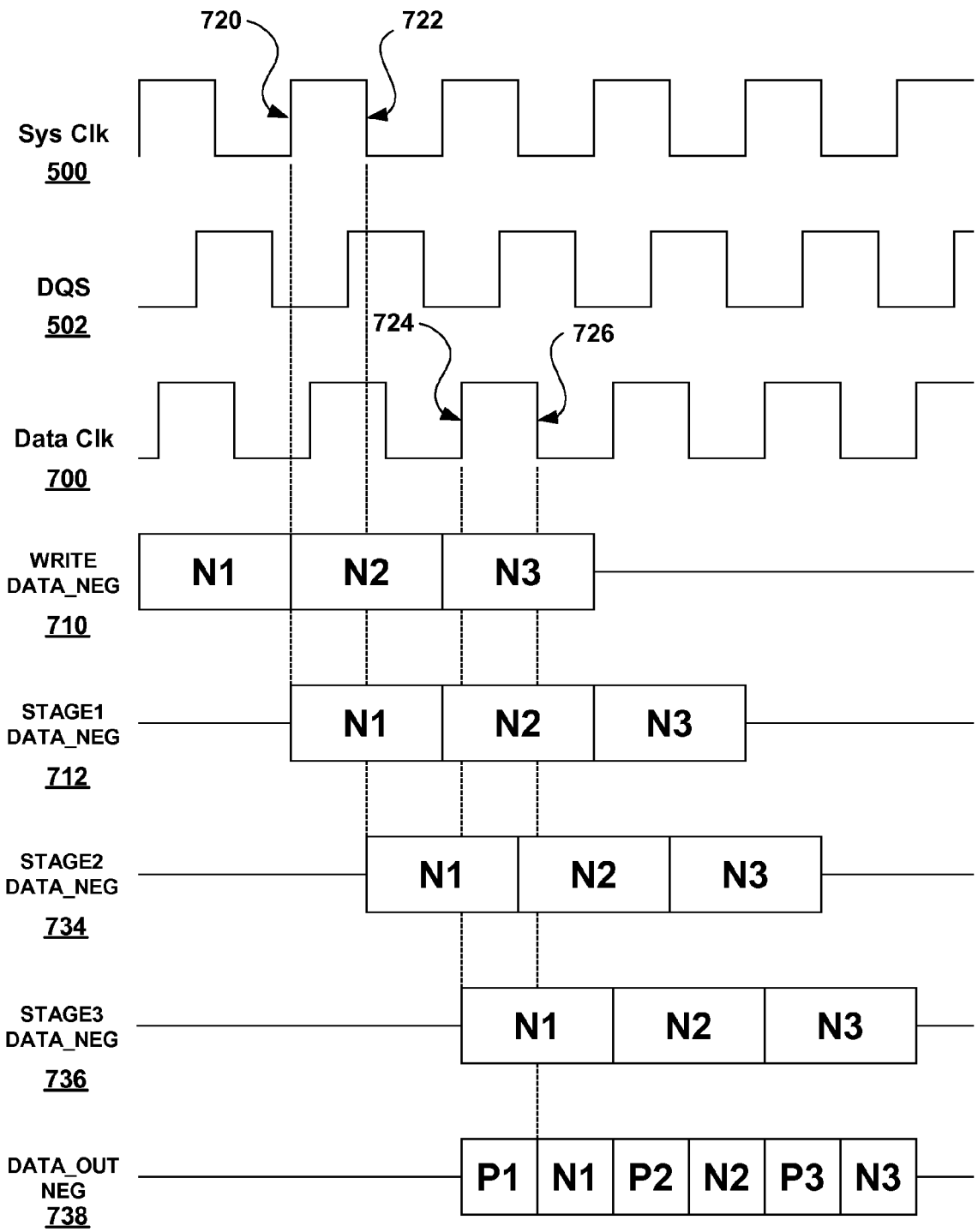
FIG. 7B is a timing diagram illustrating data transfer timing for data transferred on the negative edge of the data clock utilizing small shift domain transfer logic, in accordance with an embodiment of the present invention.

FIG. 7B is a timing diagram illustrating data transfer timing for data transferred on the negative edge of the data clock utilizing small shift domain transfer logic 302b, in accordance with an embodiment of the present invention. In addition to the system clock signal 500, DQS signal 502, and the data clock signal 700, FIG. 7B includes a WRITE_DATA_NEG signal 710, STAGE1_DATA_NEG signal 712, STAGE2_DATA_NEG signal 714, STAGE3_DATA_NEG signal 716, and the DATA_OUT_NEG signal 718. The WRITE_DATA_NEG signal 710 represents the data to be transferred on the negative edge of the data clock. The STAGE1_DATA_NEG signal 704 is the output of the stage one latch 606, while the STAGE2_DATA_NEG signal 706 and the STAGE3_DATA_NEG signal 716 are the output signals of the stage two latch 608 and the stage three latch 610, respectively. Finally, the DATA_OUT_NEG signal 718 is the data to be utilized in the data clock domain on the negative edge of the data clock.

As mentioned above, the latches of the small shift domain transfer logic 302b provide an appropriate delay for negative edge data transfer when the phase shift relationship between the system clock signal and the DQS signal is less than one half a clock period. For example, referring to FIGS. 6B and 7B, to transfer the WRITE_DATA_NEG from the system clock domain to the data clock domain, the WRITE_DATA_NEG signal is clocked into the stage one latch 606 utilizing the rising edge of system clock signal 500. As shown in FIG. 7B, WRITE_DATA_NEG N1 is clocked into the stage one latch 606 on a rising edge of the system clock signal 500 at point 720, and as a result, the N1 data is placed on the STAGE1_DATA_NEG signal 712. The N1 data, now on the STAGE1_DATA_NEG signal 712, is latched into the stage two latch 608 on the following falling edge of the system clock signal 500 at point 722, resulting in the N1 data being placed on the STAGE2_DATA_NEG signal 714. Next, the N1 data, now on the STAGE2_DATA_NEG signal 714, is latched into the stage three latch 610 on the following rising edge of the data clock signal 700 at point 724, resulting in the N1 data being placed on the STAGE3_DATA_NEG signal 716. Thereafter, on the next falling edge of the data clock signal 700 at point 726, the N1 data is clocked into the data clock domain register 612 and thus placed on the DATA_OUT_NEG signal 718 for use in the data clock domain.

As discussed previously, the phase discriminator selects the output of either the small shift domain transfer logic or the large shift domain transfer logic based on whether the DQS signal is shifted less than one half a clock period from the system clock signal or greater than one half a clock period from the system clock signal. When the DQS signal is shifted less than one half a clock period from the system clock signal, the phase shift relationship is considered small and thus the phase discriminator selects the small shift domain transfer logic 302 to transfer the data, as described above with reference to FIGS. 6A-7B. When the DQS signal is shifted more than one half a clock period from the system clock signal, the phase shift relationship is considered large and thus the phase discriminator selects the large shift domain transfer logic 304 to transfer the data as described next with reference to FIGS. 8A-9B.

Figure 8A:
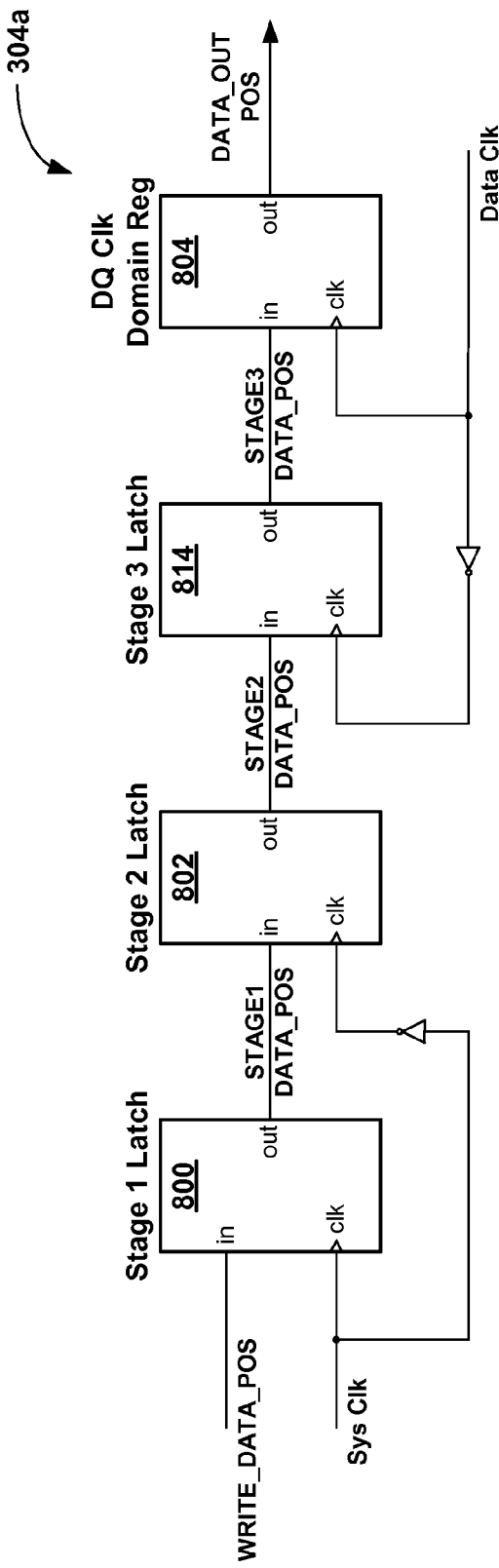
FIG. 8A is a block diagram showing large shift domain transfer logic for transferring data on the positive clock edge, in accordance with an embodiment of the present invention.

FIG. 8A is a block diagram showing large shift domain transfer logic 304a for transferring data on the positive clock edge, in accordance with an embodiment of the present invention. As illustrated in FIG. 8A, the large shift domain transfer logic 304a includes a stage one latch 800, a stage two latch 802, a stage three latch 814, and a data clock domain register 804. The stage one latch 800 receives the positive clock edge data (WRITE_DATA_POS) as input and is clocked using the rising edge the system clock signal. The output (STAGE1_DATA_POS) of the stage one latch 800 is provided as input to the stage two latch 802, which is clocked utilizing the falling edge of the system clock signal. The output (STAGE2_DATA_POS) of the stage two latch 802 is provided as input to the stage three latch 814, which is clocked utilizing the falling edge of the data clock signal. The output (STAGE3_DATA_POS) of the stage three latch 814 is provided as input to the data clock domain register 804, which is clocked utilizing the rising edge of the data clock signal. The output (DATA_OUT_POS) of the data clock domain register 804 is available for use within the receiving data clock domain. The latches of the large shift domain transfer logic 304a provide an appropriate delay for positive edge data transfer when the phase shift relationship between the system clock signal and the DQS signal is greater than one half a clock period, as illustrated in FIG. 9A.

Figure 9A:
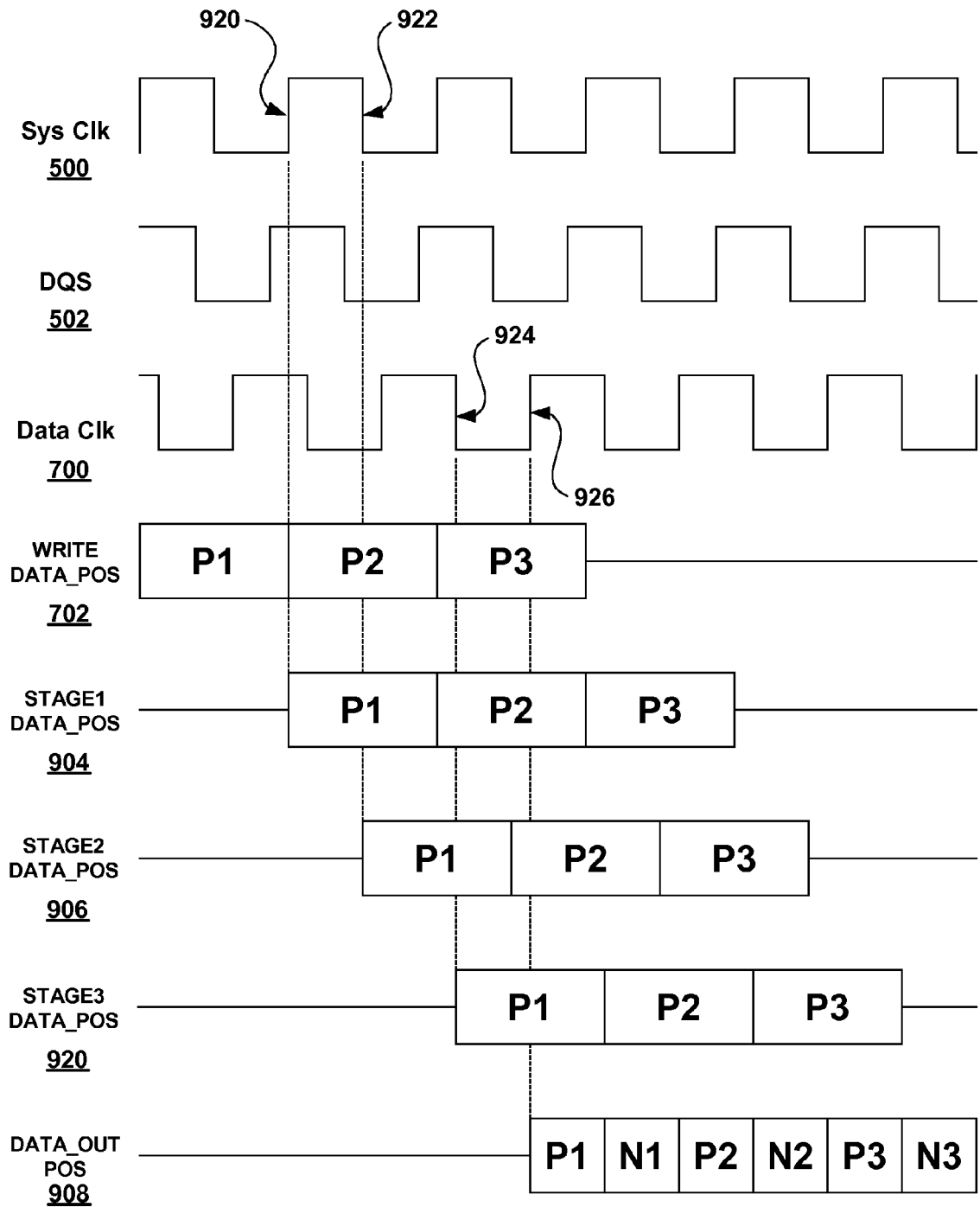
FIG. 9A is a timing diagram illustrating data transfer timing for data transferred on the positive edge of the data clock utilizing large shift domain transfer logic, in accordance with an embodiment of the present invention.

FIG. 9A is a timing diagram illustrating data transfer timing for data transferred on the positive edge of the data clock utilizing large shift domain transfer logic 304a, in accordance with an embodiment of the present invention. Similar to FIG. 7A, the signals illustrated in FIG. 9A include the system clock signal 500, the DQS signal 502, and the data clock signal 700. In addition, signals are shown for the WRITE_DATA_POS signal 702, STAGE1_DATA_POS signal 904, STAGE2_DATA_POS signal 906, STAGE3_DATA_POS signal 920, and the DATA_OUT_POS signal 908.

As mentioned above, the latches of the large shift domain transfer logic 304a provide an appropriate delay for positive edge data transfer when the phase shift relationship between the system clock signal and the DQS signal is greater than one half a clock period. For example, referring to FIGS. 8A and 9A, to transfer the WRITE_DATA_POS from the system clock domain to the data clock domain, the WRITE_DATA_POS signal is clocked into the stage one latch 800 utilizing the rising edge of system clock signal 500. As shown in FIG. 9A, WRITE_DATA_POS P1 is clocked into the stage one latch 800 on a rising edge of the system clock signal 500 at point 920, and as a result, the P1 data is placed on the STAGE1_DATA_POS signal 904. The P1 data, now on the STAGE1_DATA_POS signal 904, is latched into the stage two latch 802 on the following falling edge of the system clock signal 500 at point 922, resulting in the P1 data being placed on the STAGE2_DATA_POS signal 906. Next, the P1 data, now on the STAGE2_DATA_POS signal 906, is latched into the stage three latch 814 on the following falling edge of the data clock signal 700 at point 924, resulting in the P1 data being placed on the STAGE3_DATA_POS signal 920. Thereafter, on the next rising edge of the data clock signal 700 at point 926, the P1 data is clocked into the data clock domain register 804 and thus placed on the DATA_OUT_POS signal 908 for use in the data clock domain.

Figure 8B:
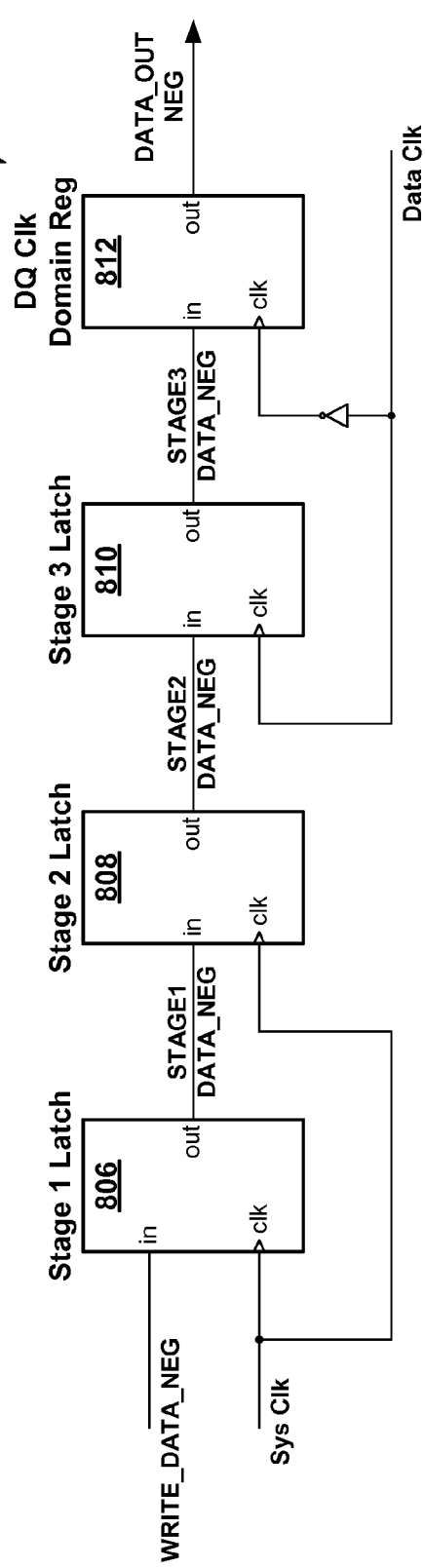
FIG. 8B is a block diagram showing large shift domain transfer logic for transferring data on the negative clock edge, in accordance with an embodiment of the present invention.

FIG. 8B is a block diagram showing large shift domain transfer logic 304b for transferring data on the negative clock edge, in accordance with an embodiment of the present invention. The large shift domain transfer logic 304b includes a stage one latch 806, a stage two latch 808, a stage three latch 810, and a data clock domain register 812 for providing negative edge data to devices in the data clock domain.

In operation, the stage one latch 806 receives the negative clock edge data (WRITE_DATA_NEG) as input and is clocked using the rising edge the system clock signal. The output (STAGE1_DATA_NEG) of the stage one latch 806 is provided as input to the stage two latch 808, which is clocked utilizing the rising edge of the system clock signal. The output (STAGE2_DATA_NEG) of the stage two latch 808 is provided as input to the stage three latch 810, which is clocked utilizing the rising edge of the data clock signal. Finally, the output (STAGE3_DATA_NEG) of the stage three latch 810 is provided as input to the data clock domain register 812, which is clocked utilizing the falling edge of the data clock signal. Hence, the output (DATA_OUT_NEG) of the data clock domain register 812 is available for use within the receiving data clock domain on the falling edge of the data clock. The latches of the large shift domain transfer logic 304b provide an appropriate delay for negative edge data transfer when the phase shift relationship between the system clock signal and the DQS signal is greater than one half a clock period, as illustrated in FIG. 9B.

Figure 9B:
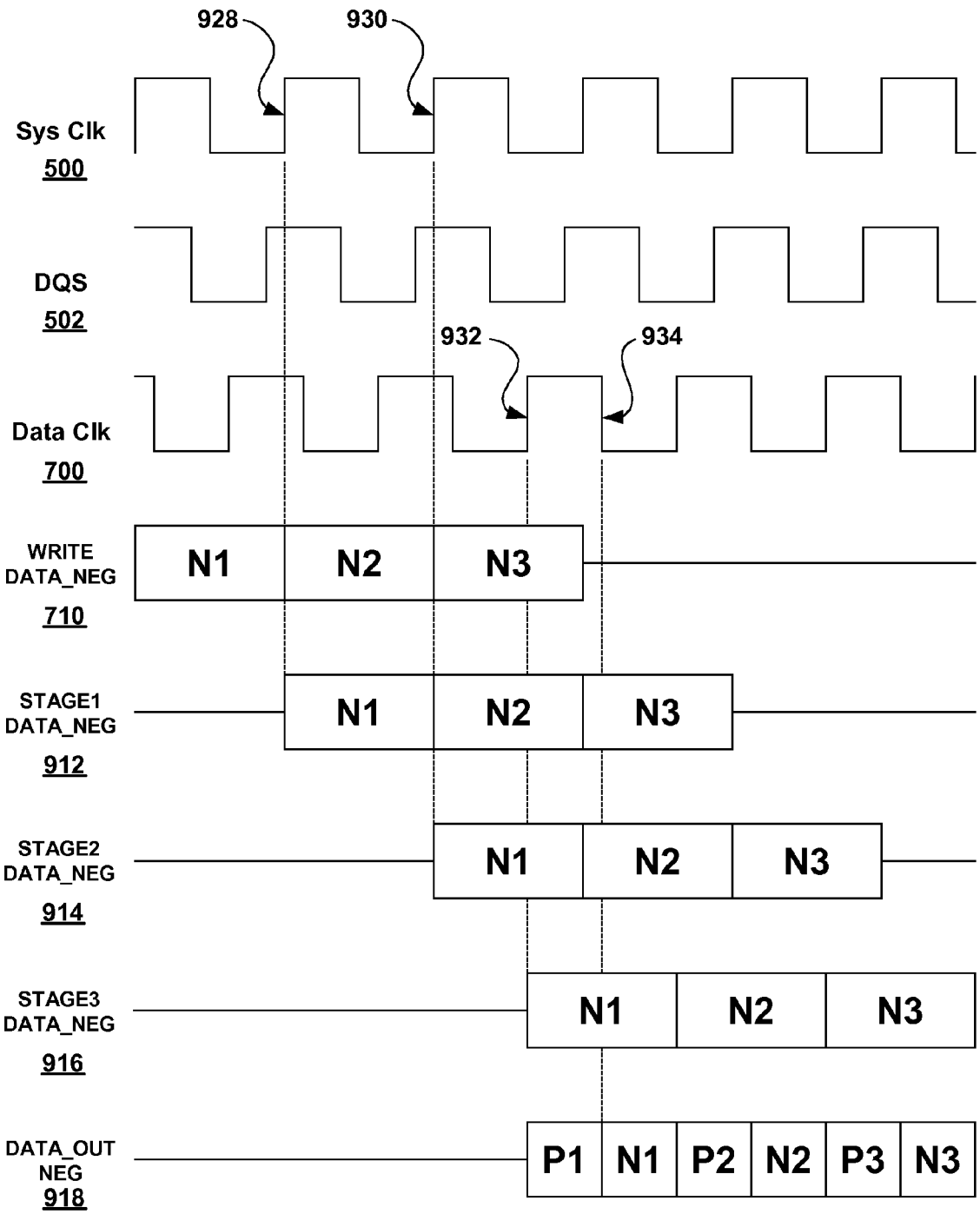
FIG. 9B is a timing diagram illustrating data transfer timing for data transferred on the negative edge of the data clock utilizing large shift domain transfer logic, in accordance with an embodiment of the present invention.

FIG. 9B is a timing diagram illustrating data transfer timing for data transferred on the negative edge of the data clock utilizing large shift domain transfer logic 304b, in accordance with an embodiment of the present invention. In addition to the system clock signal 500, DQS signal 502, and the data clock signal 700, FIG. 9B includes a WRITE_DATA_NEG signal 710, STAGE1_DATA_NEG signal 912, STAGE2_DATA_NEG signal 914, STAGE3_DATA_NEG signal 916, and the DATA_OUT_NEG signal 918.

As mentioned above, the latches of the large shift domain transfer logic 304b provide an appropriate delay for negative edge data transfer when the phase shift relationship between the system clock signal and the DQS signal is greater than one half a clock period. For example, referring to FIGS. 8B and 9B, to transfer the WRITE_DATA_NEG from the system clock domain to the data clock domain, the WRITE_DATA_NEG signal is clocked into the stage one latch 806 utilizing the rising edge of system clock signal 500. As shown in FIG. 9B, WRITE_DATA_NEG N1 is clocked into the stage one latch 806 on a rising edge of the system clock signal 500 at point 928, and as a result, the N1 data is placed on the STAGE1_DATA_NEG signal 912. The N1 data, now on the STAGE1_DATA_NEG signal 912, is latched into the stage two latch 808 on the following rising edge of the system clock signal 500 at point 930, resulting in the N1 data being placed on the STAGE2_DATA_NEG signal 914. Next, the N1 data, now on the STAGE2_DATA_NEG signal 914, is latched into the stage three latch 810 on the following rising edge of the data clock signal 700 at point 932, resulting in the N1 data being placed on the STAGE3_DATA_NEG signal 916. Thereafter, on the next falling edge of the data clock signal 700 at point 934, the N1 data is clocked into the data clock domain register 812 and thus placed on the DATA_OUT_NEG signal 918 for use in the data clock domain.

In this manner, embodiments of the present invention enable transferring of data between asynchronous clock domains, without prior knowledge of the exact relationship between the clock domains. As described above, during operation, embodiments of the present invention advantageously determine a phase shift relationship between the clock domains. Embodiments then utilize appropriate transfer logic depending on the particular phase shift relationship determined. As a result, embodiments of the present invention can provide more or less delay to appropriately transfer the data between two asynchronous clock domains.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for transferring data between asynchronous clock domains in relation to a phase shift relationship, the asynchronous clock domains including a source clock domain operating with a source clock signal and a receiving clock domain operating with a receiving clock signal, the method comprising:
    determining the phase shift relationship between the source clock signal and a data strobe signal (DQS), wherein the DQS has a fixed relationship with the receiving clock signal;
    providing data, the source clock signal, and the receiving clock signal to a small shift domain transfer logic and a large shift domain transfer logic, wherein the small shift logic and the large shift logic provide for outputting a delayed data signal of a first delay and of a second delay, respectively;
    providing the source clock signal and the DQS to a phase discriminator;
    using the phase discriminator, comparing the phase shift relationship with a predetermined threshold and selecting, via a transfer signal, if the phase relationship is less than a predetermined threshold, the small shift domain transfer logic or, if the phase relationship is greater than the predetermined threshold, the large domain transfer logic, to transfer data between the source clock domain and the receiving clock domain; and,
    if the small shift domain is selected, transferring data using the small shift domain transfer logic and outputting the delayed data signal having the first delay; and,
    if the large shift domain is selected, transferring the data using the large shift domain transfer logic and outputting the delayed data signal having the second delay being an additional half period of the source clock signal in comparison to the first delay;
    wherein the first and second delays are provided by the small and large domain transfer logics, respectively, to enable the data transfer to avoid timing problems that result in setup and hold violations and the outputted delayed data signal is a synchronized data signal for use by one or more devices in the receiving clock domain.

2. The method of claim 1, wherein the small shift domain transfer logic includes a first plurality of stage operations that include:
    latching the data on a rising edge of the source clock signal to generate stage one data; and
    latching the stage one data on a falling edge of the receiving clock signal to generate stage two data.

3. The method of claim 2, further including the operation of storing the stage two data on a rising edge of the receiving clock signal to generate synchronized data operable to be supplied to circuitry disposed in the receiving clock domain.

4. The method of claim 1, wherein the large shift domain transfer logic includes a second plurality of stage operations that include:
    latching the data on a rising edge of the source clock signal to generate stage one data;
    latching the stage one data on a falling edge of the source clock signal to generate stage two data; and
    latching the stage two data on a falling edge of the receiving clock signal to generate stage three data.

5. The method of claim 4, further including the operation of storing the stage three data on a rising edge of the receiving clock signal to generate synchronized data operable to be supplied to circuitry disposed in the receiving clock domain.

6. The method of claim 1, wherein the receiving clock signal is a data clock signal.

7. The method of claim 1, further comprising transferring negative edge data between the source clock domain and the receiving clock domain when the phase shift relationship is below a predetermined threshold using a third plurality of stage operations including:
    latching the negative edge data on a rising edge of the source clock signal to generate stage one negative edge data;
    latching the stage one negative edge data on a falling edge of the source clock signal to generate stage two negative edge data; and
    latching the stage two negative edge data on a rising edge of the receiving clock signal to generate stage three negative edge data.

8. The method of claim 1, further comprising transferring negative edge data between the source clock domain and the receiving clock domain when the phase shift relationship is above a predetermined threshold using a fourth plurality of stage operations including:
    latching the negative edge data on a rising edge of the source clock signal to generate stage one negative edge data;
    latching the stage one negative edge data on a rising edge of the source clock signal to generate stage two negative edge data; and
    latching the stage two negative edge data on a rising edge of the receiving clock signal to generate stage three negative edge data.

9. A memory controller capable of transferring data between asynchronous clock domains in relation to a phase shift relationship, the asynchronous clock domains including a source clock domain operating with a source clock signal and a receiving clock domain operating with a receiving clock signal, comprising:

logic that determines the phase shift relationship between the source clock signal and a data strobe signal (DQS), wherein the DQS has a fixed relationship with the receiving clock signal;

logic that transfers data between the source clock domain and the receiving clock domain using a small shift domain transfer logic when the phase shift relationship is below a predetermined threshold; and logic providing data, the source clock signal, and the receiving clock signal to a small shift domain transfer logic and a large shift domain transfer logic, wherein the small shift logic and the large shift logic provide for outputting a delayed data signal of a first delay and of a second delay, respectively;

logic for providing the source clock signal and the DQS to a phase discriminator;

logic for using the phase discriminator to compare the phase shift relationship with a predetermined threshold and select, via a transfer signal, if the phase relationship is less than a predetermined threshold, the small shift domain transfer logic or, if the phase relationship is greater than the predetermined threshold, the large domain transfer logic, to transfer data between the source clock domain and the receiving clock domain; and, logic that transfers the data between the source clock domain and the receiving clock domain using, if the small shift domain is selected, the small shift domain transfer logic and outputting the delayed data signal having the first delay; and logic that transfers the data between the source clock domain and the receiving clock domain using, if the large shift domain is selected, the large shift domain transfer logic and outputting the delayed data signal having the second delay being an additional half period of the source clock signal in comparison to the first delay;

wherein the first and second delays are provided by the small and large domain transfer logics, respectively, to enable the data transfer to avoid timing problems that result in setup and hold violations and the outputted delayed data signal is a synchronized data signal for use by one or more devices in the receiving clock domain.

10. The memory controller of claim 9, wherein the small shift domain transfer logic includes a first plurality of stage operations that include:
   latching the data on a rising edge of the source clock signal to generate stage one data; and
   latching the stage one data on a falling edge of the receiving clock signal to generate stage two data.

11. The memory controller of claim 10, further including logic that stores the stage two data on a rising edge of the receiving clock signal to generate synchronized data operable to be supplied to circuitry disposed in the receiving clock domain.

12. The memory controller of claim 9, wherein the large shift domain transfer logic includes a second plurality of stage operations that include:
   latching the data on a rising edge of the source clock signal to generate stage one data;
   latching the stage one data on a falling edge of the source clock signal to generate stage two data; and
   latching the stage two data on a falling edge of the receiving clock signal to generate stage thee data.

13. The memory controller of claim 12, further including logic that stores the stage three data on a rising edge of the receiving clock signal to generate synchronized data operable to be supplied to circuitry disposed in the receiving clock domain.

* * * * *